(12) United States Patent
Huang et al.

(10) Patent No.: US 8,710,557 B2
(45) Date of Patent: Apr. 29, 2014

(54) MOS TRANSISTOR HAVING COMBINED-SOURCE STRUCTURE WITH LOW POWER CONSUMPTION AND METHOD FOR FABRICATING THE SAME

(75) Inventors: Ru Huang, Beijing (CN); Qianqian Huang, Beijing (CN); Zhan Zhan, Beijing (CN); Xin Huang, Beijing (CN); Yangyuan Wang, Beijing (CN)

(73) Assignee: Peking University, Beijing (CN)

( * ) Notice: Subject to any disclaimer, the term of this patent is extended or adjusted under 35 U.S.C. 154(b) by 0 days.

(21) Appl. No.: 13/501,241

(22) PCT Filed: Oct. 14, 2011

(86) PCT No.: PCT/CN2011/080779
§ 371 (c)(1),
(2), (4) Date: Apr. 10, 2012

(87) PCT Pub. No.: WO2012/068928
PCT Pub. Date: May 31, 2012

(65) Prior Publication Data
US 2012/0313154 A1    Dec. 13, 2012

(30) Foreign Application Priority Data
Nov. 25, 2010  (CN) .......................... 2010 1 0560176

(51) Int. Cl.
*H01L 29/76*  (2006.01)
(52) U.S. Cl.
USPC ........... 257/288; 257/327; 257/341; 257/343; 257/334; 257/E21.409; 257/E29.255
(58) Field of Classification Search
USPC ................. 257/288, 327, 341, 343, E21.409, 257/E29.255
See application file for complete search history.

(56) References Cited

U.S. PATENT DOCUMENTS

2003/0020125 A1    1/2003  Mandelman
2006/0125041 A1    6/2006  Yang

FOREIGN PATENT DOCUMENTS

| CN | 101719517 A | 6/2010 |
| CN | 102074583 A | 5/2011 |
| JP | 4317339 A | 11/1992 |
| TW | 352463 A | 2/1999 |

*Primary Examiner* — Long Pham
(74) *Attorney, Agent, or Firm* — Fenwick & West LLP

(57) ABSTRACT

The present invention discloses a MOS transistor having a combined-source structure with low power consumption, which relates to a field of field effect transistor logic devices and circuits in CMOS ultra-large-scaled integrated circuits. The MOS transistor includes a control gate electrode layer, a gate dielectric layer, a semiconductor substrate, a Schottky source region, a highly-doped source region and a highly-doped drain region. An end of the control gate extends to the highly-doped source region to form a T shape, wherein the extending region of the control gate is an extending gate and the remaining region of the control gate is a main gate. The active region covered by the extending gate is a channel region, and material thereof is the substrate material. A Schottky junction is formed between the Schottky source region and the channel under the extending gate. The combined-source structure according to the invention combines a Schottky barrier and a T-shaped gate, improves the performance of the device, and the fabrication method thereof is simple. Thus, a higher turn-on current, a lower leakage current, and a steeper subthreshold slope can be obtained, and the present application can be applied in the field of low power consumption and have a higher practical value.

6 Claims, 3 Drawing Sheets

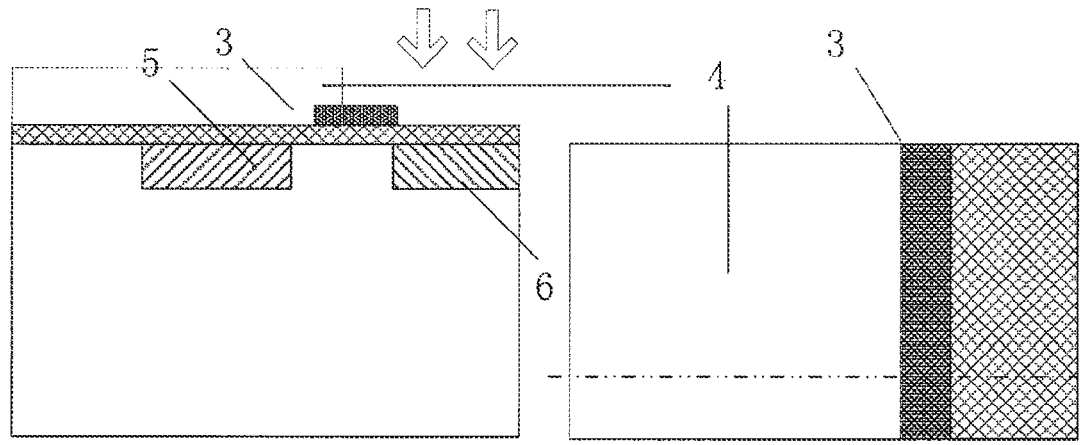
Figure 4a                    Figure 4b
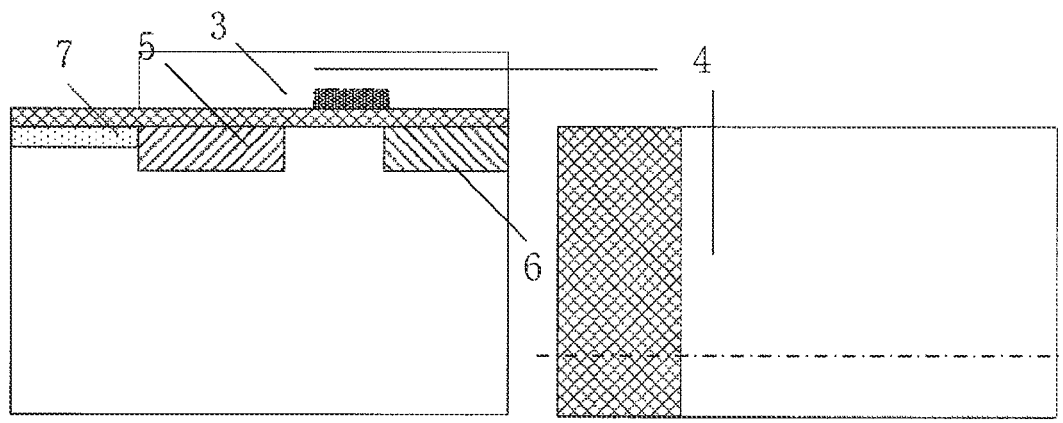
Figure 5a                    Figure 5b
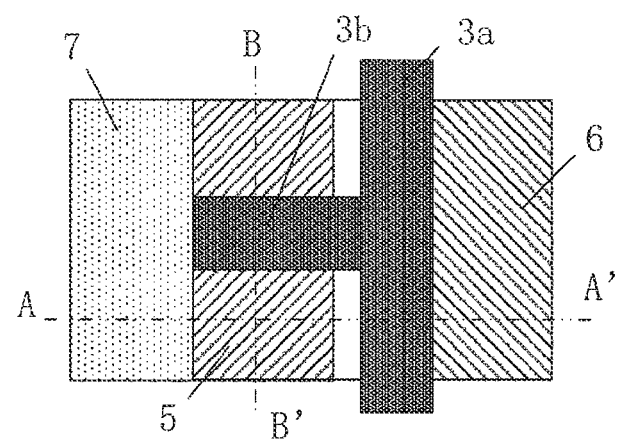
Figure 6

MOS TRANSISTOR HAVING COMBINED-SOURCE STRUCTURE WITH LOW POWER CONSUMPTION AND METHOD FOR FABRICATING THE SAME

The present application claims priority to Chinese Patent Application (No. 201010560176.4), filed on Nov. 25, 2010 in the State Intellectual Property Office of People's Republic of China, which is incorporated herein by reference in its entirety.

FIELD OF THE INVENTION

The present invention relates to a field effect transistor logic device and a circuit in the field of CMOS Ultra-Large-Scaled Integrated circuit (ULSI), and particularly relates to a MOS transistor having a combined-source, which combines a Schottky barrier and a T-shaped gate, and a method for fabricating the same.

BACKGROUND OF THE INVENTION

As a continuous shrink of a size of a metal-oxide-silicon field effect transistor (MOSFET), particularly a feature size of a device entering into a nano scale, an adverse influence such as a short channel effect of the device is becoming more obvious. A drain induced barrier lowering effect (DIBL) and a band-to-band tunneling effect cause an off-state leakage current of the device to be increased; and along with a decrease of a device threshold voltage, a power consumption of an integrated circuit is increased. Furthermore, a subthreshold slope of the conventional MOSFET cannot be reduced with the shrink of the device size due to a theory limitation of KT/q. Meanwhile, a subthreshold leakage current constantly increases as the threshold voltage reduces. In order to overcome more and more challenges faced with the nano-sized MOSFET, a new device structure and fabrication process method become a focus in the field of the small size device.

As early as 1960s, a Schottky barrier MOS field effect transistor (Schottky barrier MOSFET) structure was proposed by Lepselter and Sze, in which a source and a drain each uses a metal or a silicide to replace a conventional doping, and a turn-on of the transistor is achieved by a direct barrier tunneling of carriers at the source terminal. The Schottky barrier MOSFET greatly reduces a source/drain parasitic resistance of the transistor, and achieves an ultra-shallow junction of the source/drain. Meanwhile, a simple process for fabricating the transistor requires less thermal budget, thus providing a possible solution method for a usage of a high K and a metal gate material. However, an application of the Schottky barrier MOSFET is greatly limited due to a large off-state leakage current and a small on-state current of the Schottky junction. Moreover, as for a problem that a substhreshold slope of the MOSFET has a theory limitation of 60 mV/dec, recently researchers have proposed a possible solution, in which a tunneling field effect transistor (TFET) is used. The TFET achieves a turn-on by controlling a band-to-band tunneling of a reverse-biased PIN junction through a gate, and has a very small leakage current. The TFET has many excellent characteristics such as a low leakage current, a low subthreshold slope, a low operation voltage, and a low power consumption. However, due to a limitation of tunneling probability and tunneling area of the source/drain region, the TFET is also faced with a problem of a low on-state current, which is the same as the Schottky barrier MOSFET. A patent (CN 101719517A) proposes a Schottky tunneling transistor, which resolves a self-alignment problem of the TFET by using a Schottky junction at the source/drain. However, it is also faced with the problem of low on-state current.

SUMMARY OF THE INVENTION

An object of the present invention is to provide a MOS transistor having a combined-source structure with low power consumption, which combines a Schottky junction and a band-to-band tunneling mechanism, and a method for fabricating the same. By being compatible with a conventional CMOS process and having an identical area of an active region with a MOSFET, the structure according to the invention can significantly improve a turn-on current of the transistor, reduce a leakage current and a parasitic resistance, and exhibit a better subthreshold characteristic.

A technical solution of the present invention is as follows.

A MOS transistor having a combined-source structure with low power consumption includes a control gate electrode layer, a gate dielectric layer, a semiconductor substrate, a highly-doped source region and a highly-doped drain region, wherein a side of the highly-doped source region far from a channel is connected with a Schottky source region, an end of the control gate extends to the highly-doped source region to form a T shape, in which an extending region of the control gate is an extending gate, and the remaining region of the control gate is a main gate; an active region covered by the extending gate is a channel region, and material thereof is the substrate material; the highly-doped source region is formed by highly doping a semiconductor and is disposed on both ends of the extending gate in a width direction of the active region; the Schottky source region is formed of metal or metal silicide, and a Schottky junction (a metal-semiconductor junction) is formed between the Schottky source region and the channel under the extending gate. The highly-doped drain region, which is disposed at the unextending side of the control gate, is formed by highly doping, and a dopant type thereof is opposite to that of the highly-doped source region.

A width of the extending gate must be smaller than an injection width of the active region at the source terminal, so as to ensure the source region partially surround the extending gate and ensure a large tunneling area. The width of the extending gate must be small to a certain value (in the range of 1-2 μm, according to different concentrations of the channel and the active region) so that a built-in potential of the source junction at both sides of the extending gate may cause the channel region under the extending gate depleted, and thus a static leakage current of the device can be reduced.

The length of the extending gate may be in any direction, depending on the desired increasing amount of current, but usually not exceed the edge of the active region at the source terminal.

A certain margin may be remained between the main gate and the highly-doped drain in order to inhibit a bipolar turn-on phenomenon of this structure, where the main gate region may lose a control ability to obtain a better subthreshold slope.

A method for fabricating the above-mentioned MOS transistor having a combined-source structure, which combines a Schottky junction and a T-shaped gate, includes the following steps:

1) defining an active region over a semiconductor substrate by a shallow isolation;

2) growing a gate dielectric layer;

3) depositing a gate electrode layer, and then forming a main gate pattern and an extending gate pattern by photolithographing and etching the gate electrode layer;

4) photolithographing a doped source region, and performing an ion implantation by using a photoresist and the gate as a mask to form a highly-doped source region;

5) photolithographing a doped drain region, and performing an ion implantation by using a photoresist and the gate as a mask to form a highly-doped drain region, and performing a rapid high temperature annealing to activate doped impurities;

6) photolithographing a metal region in the source, sputtering a metal layer, and performing a low temperature annealing to form a compound made of the metal and the semiconductor; and then removing the unreacted metal to form a Schottky source region;

7) performing conventional CMOS subsequent processes, including depositing a passivation layer, opening a contact hole, and a metallization and etc., to form the MOS transistor.

In the above fabrication method, in the step 1), the semiconductor substrate material is selected from Si, Ge, SiGe, GaAs, or other binary or ternary compound semiconductors from II-IV, III-V and IV-IV group, silicon-on-insulator (SOI), or germanium-on-insulator (GOI).

In the above fabrication method, in the step (2), a material of the gate dielectric layer is selected from silicon oxide, hafnium oxide and hafnium nitride.

In the above fabrication method, in the step 2), a method for growing the gate dielectric layer is selected from one of the following methods: a conventional thermal oxidation, a nitrided thermal oxidation, a chemical vapor deposition, and a physics vapor deposition.

In the above fabrication method, in the step 3), a material of the gate electrode layer is selected from a doped polysilicon, cobalt and nickel, and other metal and metallic silicide.

In the above fabrication method, in the step 6), the metal material is selected from Pt, Er, Co, Ni, and other metal which may react with the substrate semiconductor material by annealing to form a compound.

The advantages and beneficial effects of the present invention are as follows.

1. This structure can control a surface potential of the channel more effectively by using the T-shaped gate, so as to lower a conduction band or rise a valence band in energy bands of the channel surface to enhance an electric field at the source junction, thus promoting an occur of a band-to-band tunneling and generating a turn-on current, and consequently breaking the limitation of a conventional MOSFET subthreshold.

2. This structure makes a full use of the three edges of the extending gate, where the three edges achieve the turn-on by using the band-to-band tunneling and the Schottky junction tunneling mechanism, respectively. By adjusting a length of the edge of the extending gate, a large tunneling area is achieved, the turn-on current of the device is greatly increased, and the subthreshold slope of the device is improved.

3. The parasitic resistance of the device is reduced by inducing the Schottky source region. Further, by strictly controlling a width of the extending gate, the channel region under the extending gate is depleted, so that a problem of leakage current caused by the Schottky junction is greatly reduced, and a low leakage current is achieved.

4. The process method for fabricating the device structure is completely compatible with a conventional MOSFET fabrication process.

In short, a combined-source structure is used in the device according to the invention, which combines a Schottky barrier and a T-shaped gate, and thus the performance of the device is improved with a simple fabrication method. As compared with a conventional MOSFET, under the same process condition and the same size of the active region, the MOSFET of the present invention can obtain a higher turn-on current, a lower leakage current, and a steeper subthreshold slope, and can be applied in the field of low power consumption device and has a higher practical use.

BRIEF DESCRIPTION OF THE DRAWINGS

FIG. 4a is a cross-sectional view of a device after forming a doped drain region by photolithographing a highly-doped drain region and performing an ion implantation, which is taken in the dotted line direction of FIG. 4b, and FIG. 4b is a corresponding top view of the device;

FIG. 5a is a cross-sectional view of a device after photolithographing a Schottky source region, sputtering metal and performing annealing to form silicide, which is taken in the direction of the dotted line of FIG. 5b, and FIG. 5b is a corresponding top view of the device;

FIG. 6 is a top view of a MOS transistor device having a combined-source structure according to the present invention;

Figure 1:
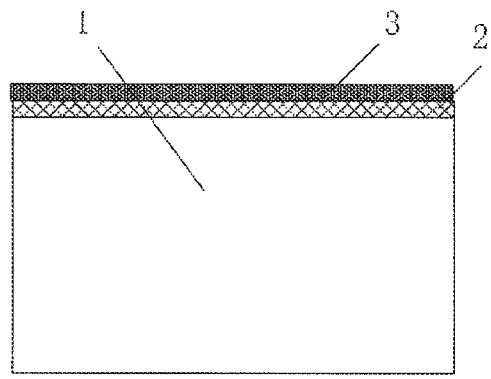
FIG. 1 is a schematic diagram of process steps for growing a gate dielectric layer and depositing a gate electrode over a semiconductor substrate.

In the drawings:
reference sign "1" represents a semiconductor substrate;
reference sign "2" represents a gate dielectric layer:
reference sign "3" represents a gate electrode layer (wherein, reference sign "3a"
represents a main gate, reference sign "3b" represents an extending gate);
reference sign "4" represents a photoresist;
reference sign "5" represents a highly represents doped source region;
reference sign "6" represents a highly represents doped drain region; and
reference sign "7" represents a Schottky source region.

DETAILED DESCRIPTION OF THE EMBODIMENTS

Hereinafter, the present invention will be further described by examples. It is noted that embodiments are disclosed to help further understand the present invention. However, it will be apparent to those skilled in the art that various changes and modifications may be possible without departing from the spirit and scope of the invention as defined in the following claims. Thus, the present invention should not be limited to the content disclosed by the embodiments; rather, the scope of the present invention is determined by the appended claims.

A specific example of a fabrication method of the present invention includes the process steps as shown in FIGS. 1 to 5b.

1. An isolation layer for an active region is fabricated over a bulk silicon substrate 1 with a crystal orientation of (100) by using a shallow isolation technology, wherein the substrate is lightly doped. A gate dielectric layer 2 is thermally grown, wherein the gate dielectric layer 2 is $SiO_2$ and has a thickness of 1-5 nm, A gate electrode layer 3 is deposited, wherein the gate electrode layer 3 is a doped polysilicon layer and has a thickness of 150-300 nm, as shown in FIG. 1.

Figure 2A:
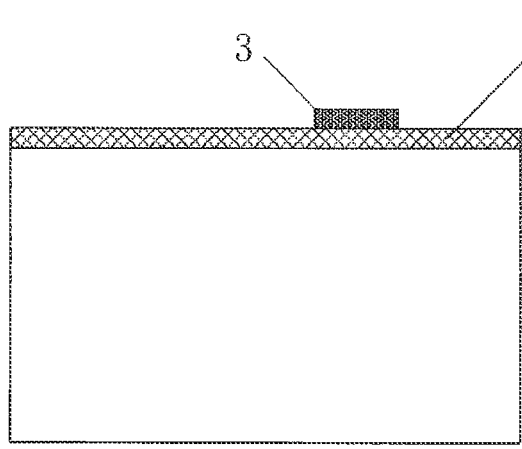
FIG. 2a is a cross-sectional view of a device after a gate electrode is formed by photolithographing and etching, which is taken in the dotted line direction of FIG. 2b.
Figure 2B:
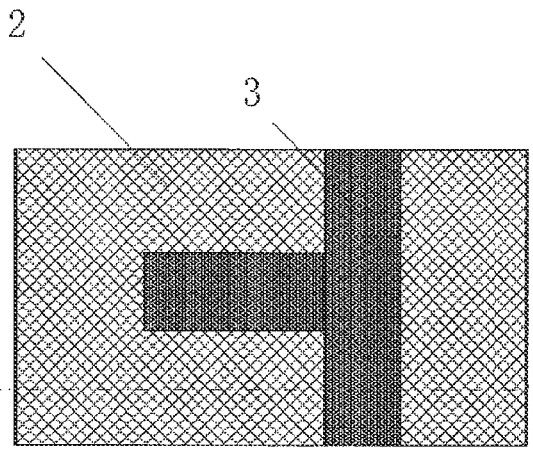
FIG. 2b is a corresponding top view of the device.

2. A gate pattern, which includes a main gate 3a and an extending gate 3b, is formed by photolithographing. The gate electrode layer 3 is etched to the gate dielectric layer 2, wherein a width of the extending gate is 1-2 μm, as shown in FIGS. 2a and 2b.

Figure 3A:
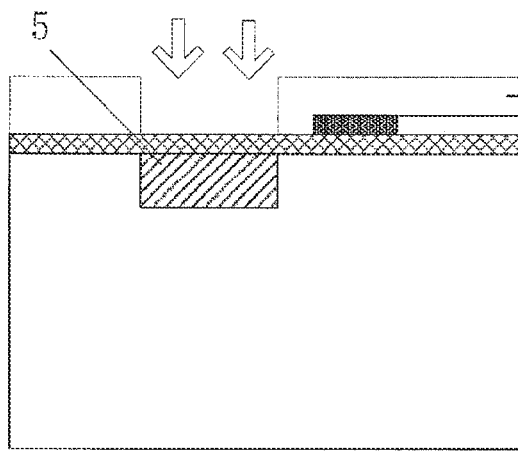
FIG. 3a is a cross-sectional view of a device after forming a doped source region by photolithographing a highly-doped source region and performing an ion implantation, which is taken in the dotted line direction of FIG. 3b.
Figure 3B:
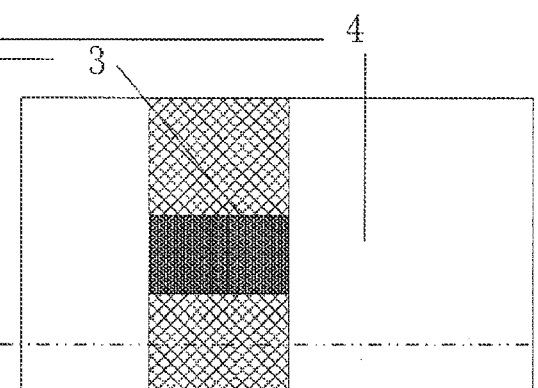
FIG. 3b is a corresponding top view of the device.
Figures 7A, 7B:
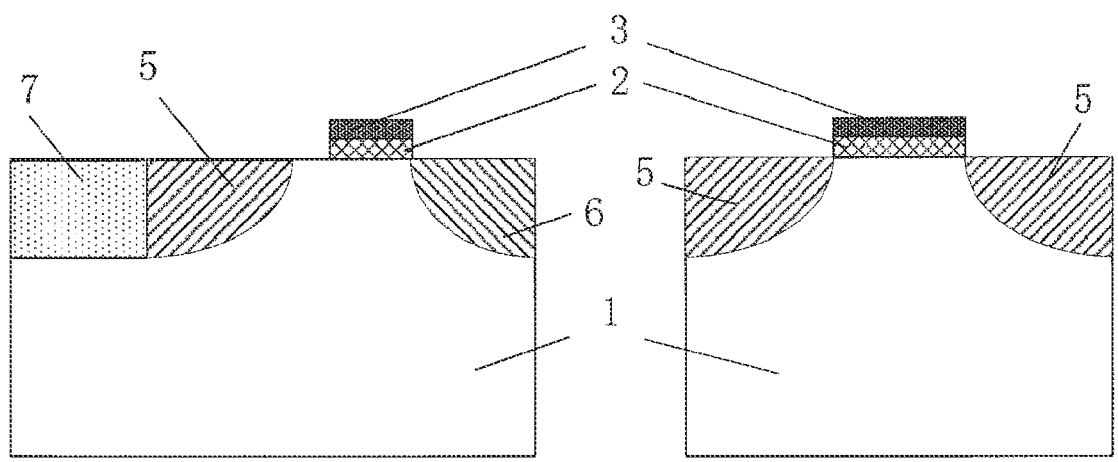
FIG. 7a is a cross-sectional view of a transistor according to the present invention, which is taken in the direction of line AA' of FIG. 6.
FIG. 7b is a cross-sectional view of a transistor according to the present invention, which is taken in the direction of line BB' of FIG. 6.

3. A doped source region pattern is formed by photolithographing, wherein a distance from a left side of the main gate to a right side of the doped source region is 0-1 μm. An ion implantation process is performed to the source by using a photoresist 4 as a mask, so as to form a highly-doped source region 5, wherein an energy of the ion implantation is 40 keV, and the doped impurities are $BF^+$, as shown in FIGS. 3a and 3b.

4. A doped drain region pattern is formed by photolithographing. An ion implantation process is performed to the drain region by using a photoresist as a mask, so as to form a highly-doped drain region 6, wherein an energy of the ion implantation is 50 keV, and the doped impurities are As+, as shown in FIGS. 4a and 4b. A rapid high temperature annealing is performed to activate the impurities doped into the source and the drain.

5. A pattern of a metal region in source is formed by photolithographing. A metal Ni layer is sputtered by using a photoresist as a mask (a passivation layer may be grown firstly, and photolithographing and etching are performed to form the pattern of the metal region). A low temperature annealing is performed to form a metal silicide as a Schottky source region 7 of the device, as shown in FIGS. 5a and 5b.

Finally conventional CMOS subsequent processes, including depositing a passivation layer, opening a contact hole, and a metallization, and etc. are performed to form the MOS transistor having a combined-source structure with low power consumption.

While the present invention has been disclosed by preferred embodiments, the preferred embodiments are not used to limit the present invention. Those skilled in the art should understand that, the technical solution of the present invention may be made a certain change and modification or modified to equivalent embodiments with equivalent variations without departing from the scope of technical solution of the present invention by using the methods and technical contents disclosed above. Any modifications, equivalent changes and improvements of the above embodiments which are not departing from the content of the technical solution of the present invention, according to the technical concept of the present invention, are all within the scope protected by the technical solution of the present invention.

What is claimed is:

1. A method for fabricating a MOS transistor having a combined-source structure with low power consumption, comprising the following steps:
   1) defining an active region over a semiconductor substrate by a shallow isolation;
   2) growing a gate dielectric layer;
   3) depositing a gate electrode layer, and then forming a main gate pattern and a extending gate pattern by photolithographing and etching the gate electrode layer;
   4) performing photolithographing to form a doped source region, and performing an ion implantation by using a photoresist and the gate as a mask to form a highly-doped source region;
   5) performing photolithographing to form a doped drain region, and performing an ion implantation by using a photoresist and the gate as a mask to form a highly-doped drain region; and performing a rapid high temperature annealing to activate the doped impurities;
   6) performing photolithographing to form a metal region in the source, sputtering a metal layer, and performing a low temperature annealing to form a compound made of the metal and the semiconductor; and then removing the unreacted metal to form a Schottky source region; and
   7) performing conventional CMOS subsequent processes, comprising depositing a passivation layer, opening a contact hole, and a metallization, to form the MOS transistor.

2. The method according to claim 1, wherein, in the step 1), the semiconductor substrate material is selected from Si, Ge, SiGe, GaAs, or other binary or ternary compound semiconductor from II-VI, III-V and IV-IV group, silicon-on-insulator, or germanium-on-insulator.

3. The method according to claim 1, wherein, in the step 2), a material of the gate dielectric layer is selected from silicon oxide, hafnium oxide, hafnium nitride, and etc.

4. The method according to claim 1, wherein, in the step 2), a method for growing the gate dielectric layer is selected from one of the following methods: a conventional thermal oxidation, a nitrided thermal oxidation, a chemical vapor deposition, and a physical vapor deposition.

5. The method according to claim 1, wherein, in the step 3), a material of the gate electrode layer is selected from doped polysilicon, cobalt, nickel, and other metal or metallic silicide.

6. The method according to claim 1, wherein, in the step 6), the metal material is selected from Pt, Er, Co, Ni, and other metal which reacts with the substrate semiconductor material and forms a compound by annealing.

* * * * *